United States Patent [19]

Lüchinger et al.

[11] 4,196,392
[45] Apr. 1, 1980

[54] METHOD AND APPARATUS FOR MONITORING AND CONTROLLING THE ANODE DISSIPATION OF TRANSMITTERS

[75] Inventors: Hanspeter Lüchinger, Rorschach; Ole Snedkerud, Windisch; Jürg Wyss, Döttingen, all of Switzerland

[73] Assignee: BBC Brown Boveri & Company Limited, Baden, Switzerland

[21] Appl. No.: 892,977

[22] Filed: Apr. 3, 1978

[30] Foreign Application Priority Data

May 4, 1977 [CH] Switzerland .................. 5553/77

[51] Int. Cl.² ................ H03G 3/20; H04B 1/04
[52] U.S. Cl. ............................ 455/117; 455/127; 455/115; 330/128
[58] Field of Search ............... 325/186.18 T, 185, 151, 325/150, 159, 168, 169, 133, 362; 328/8, 9, 10; 330/51, 123, 128, 129–132, 207 P, 298; 331/62

[56] References Cited

U.S. PATENT DOCUMENTS

| | | | |
|---|---|---|---|
| 3,020,529 | 2/1962 | Turner | 325/150 |
| 3,870,957 | 3/1975 | Straw | 325/187 |
| 4,019,150 | 4/1977 | Lurey | 325/150 |
| 4,122,400 | 10/1978 | Mendendorf | 325/150 |

*Primary Examiner*—Benedict V. Safourek
*Assistant Examiner*—Tommy P. Chin
*Attorney, Agent, or Firm*—Oblon, Fisher, Spivak, McClelland & Maier

[57] ABSTRACT

A method and apparatus for monitoring and controlling the anode power dissipation of transmitters. First and second signals proportional to the anode power input and anode power output are produced and subtracted from each other, thus resulting in a third signal proportional to anode power dissipation. The third signal is applied to a pair of threshold value actuators, with one threshold value actuator actuating transmitter tuning elements when an initial threshold level is exceeded, and the second threshold actuator switching the transmitter off when a second threshold is exceeded.

6 Claims, 1 Drawing Figure

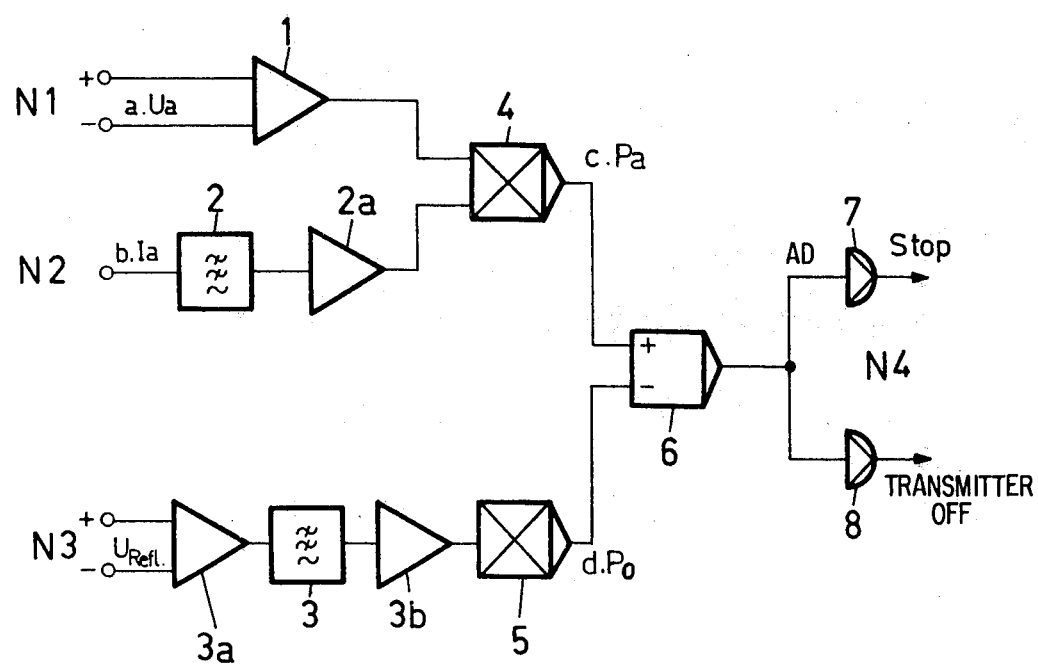

METHOD AND APPARATUS FOR MONITORING AND CONTROLLING THE ANODE DISSIPATION OF TRANSMITTERS

BACKGROUND OF THE INVENTION

1. Field of the Invention

The invention relates to a method and apparatus for monitoring the anode dissipation of transmitters.

2. Description of the Prior Art

Until a few years ago it has been customary to tune the transmitters by hand and to monitor them manually. When irregularities arose in the operation of the transmitters, it was thus possible for the operating personnel to eliminate these irregularities immediately at any time.

Due to the increased use of automatically tunable and completely remote-controlled transmitters, however, the number of possible sources of fault today has risen. However, it has been possible to bring these sources of fault under control by using highly sophisticated monitoring devices.

With remote-control transmitters there is, under certain circumstances, a danger that incorrect instructions will be generated, either as a result of incorrect storage of instructions or as a result of interference on the remote-control connections. However, the effects thereof are not always immediately visible. Overloading of a transmitting tube often arises, for example, as a result.

The tubes installed in present day high-power transmitting stations are in general very expensive. Therefore, every effort has been made and the requisite means found to construct simple, relatively inexpensive but very reliable check or monitoring instruments.

SUMMARY OF THE INVENTION

Accordingly, one object of this invention is to provide a novel method and apparatus for monitoring and controlling the anode dissipation of transmitters while avoiding the disadvantages of methods and apparata found in the prior art.

Another object is to provide a novel method and apparatus which promotes greater ease in tuning those transmitters which are manually tunable, especially during start-up of the transmitter.

These and other objects are achieved according to the invention by monitoring the transmitter anode and combining signals indicative of anode input and output voltage and current to establish anode dissipation, and actuating switch units to reduce dissipation when the anode dissipation exceeds an initial threshold level. On the other hand, if the anode transmitter dissipation rises above a second threshold higher than the initial threshold, the transmitter is switched off.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein the single drawing is a circuit diagram of the apparatus of the invention.

DETAILED DESCRIPTION OF THE PREFERRED EMBODIMENTS

Referring now to the drawing, where the reference symbols have the following significance:

1: inverting differential amplifier
2, 3: active low-pass filter
2a, 3b: amplification of the active low-pass filter
3a: differential amplifier for symmetric/asymmetric conversion
4, 5: multipliers
6: subtractor
7, 8: threshold value actuators
N1–N4: diverse inputs and outputs The stepped-down anode voltage $a \cdot U_a$ is amplified in the inverting differential amplifier 1 and fed to the multiplier 4. The voltage $b \cdot I_a$ proportional to the anode current $I_a$ is derived from the anode modulation in an active low-pass filter 2 and amplified in the amplifier 2a connected on the load side thereof. The multiplier 4 then produces a voltage $c \cdot P_a$ proportional to the input power to the transmitter anode.

A symmetrical reflectometer voltage $U_{Refl.}$, with a voltage proportional to the square root of the output power detected by a reflectometer, is converted by the differential amplifier 3a into an asymmetric voltage, freed from the modulation in an active low-pass filter 3 and amplified in an amplifier 3b. By squaring in the multiplier 5, a voltage $d \cdot P_o$ which is virtually proportional to the output power $P_o$ is obtained.

The subtractor 6 supplies a voltage $e \cdot AD$ proportional to the anode dissipation (AD) and this is fed to the two threshold value actuators 7 and 8.

The first threshold value actuator 7 has the task of keeping the anode dissipation AD below the switch-off level set on the second threshold value actuator 8 during the tuning operation. It gives the instruction to stop the sequential starting of the anode voltage when the anode dissipation becomes too great during the tuning operation. By this means a further rise in the anode dissipation, leading to switching-off of the transmitter, is prevented. As a result of frequency trimming of the automatic tuning, the dissipation AD falls below the switch-off level of the threshold actuator 7 and the anode voltage can be further increased.

If a full anode voltage of 14 kV has been reached, the dissipation AD is then controlled only by the second threshold value actuator 8. When the set maximum anode dissipation $AD_{max}$ is exceeded, this actuator 8 gives the instruction "Transmitter Off" to the transmitter control system.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An apparatus for monitoring and controlling the anode power dissipation of a transmitter producing an R.F. output power and having an anode and related tuning elements, the transmitter anode having an input voltage, an input current proportional to anode modulation, and a symmetric output power as determined by output power sending means measuring the transmitter R.F. output power, comprising:

first circuit means for deriving a first signal proportional to the input power ($P_a$) to the transmitter anode;

second circuit means for deriving a second signal proportional to the output power ($P_O$) at the transmitter anode;

subtracting means coupled to the first circuit means and the second circuit means for producing a third signal proportional to transmitter anode dissipation, the subtractor means subtracting the second signal derived by the second circuit means from the first signal derived by the first circuit means;

a first threshold value actuator having the third signal produced by the subtraction means coupled thereto, the first threshold value actuator halting the actuation of certain of the tuning elements within the transmitter in order to reduce anode dissipation when the third signal exceeds a predetermined first threshold; and, a second threshold value actuator also having the third signal produced by said subtraction means coupled thereto, the second threshold value actuator switching off the transmitter when the third signal exceeds a second predetermined threshold level.

2. An apparatus according to claim 1, wherein the first circuit means comprises:

an inverting differential amplifier having an input and an output, the input having applied thereto a fourth signal representative of a stepped-down anode input voltage;

a first active low-pass filter having an input and an output, the input of the first active low-pass filter having applied thereto a fifth signal representative of the transmitter anode modulation, the first active low-pass filter producing a signal proportional to the anode current;

a first amplifier voltage connected to the output of the first active low-pass filter, the first voltage amplifier amplifying the output of the first active low-pass filter; and, a first multiplier circuit having a pair of inputs and an output, the output of the inverting differential amplifier applied to one of the inputs of the first multiplier circuit, the output of the first voltage amplifier connected to the other input of the first multiplier circuit, the first multiplier circuit multiplying the output of the inverting differential amplifier with the output of the first voltage amplifier to produce the first signal.

3. An apparatus according to claim 1, wherein the second circuit means comprises:

differential amplifier means for converting a symmetric input signal to the differential amplifier means to an asymmetric output, the first differential amplifier having applied to its input a symmetrical transmitter output voltage signal proportional to the square root of the transmitter anode output power ($P_O$), the differential amplifier means converting the transmitter output voltage signal to an asymmetric voltage signal;

a second active low-pass filter connected to the output of the differential amplifier means, the second active low-pass filter low-pass filtering the output of the differential amplifier means;

a second voltage amplifier connected to the output of the second active low-pass filter, the second voltage amplifier amplifying the output of the second active low-pass filter; and a second multiplier circuit having two inputs and the output, the output equal to the product of the two inputs, the second multiplier circuit having its two inputs both connected to the output of the second voltage amplifier, the output of the second multiplier circuit producing the second signal proportional to the output power ($P_O$) at the transmitter anode.

4. An apparatus according to claim 1, wherein said first circuit means comprises:

means for deriving signals proportional to the transmitter anode input voltage and the transmitter anode input current; and means for deriving a signal proportional to the product of the transmitter anode input voltage and transmitter anode input current signals.

5. A method for monitoring and controlling the anode power dissipation of a transmitter producing an R.F. output and having an anode and related tuning elements, comprising:

monitoring transmitter anode input power and transmitter R.F. output power;

determining the power dissipation of the transmitter anode based on the difference between the monitored transmitter anode input power and the transmitter R.F. output power;

establishing an initial threshold value of the anode dissipation;

actuating transmitter tuning elements in order to reduce anode dissipation when the first initial threshold value is exceeded;

establishing a second threshold value for anode dissipation, the second threshold value being higher than the initial threshold value; and, switching the transmitter off when the anode dissipation exceeds the second threshold value.

6. A method according to claim 5, wherein the transmitter has an anode input voltage and anode input current, further comprising:

sensing the transmitter anode input voltage, the transmitter anode input current, and the transmitter output power;

producing signals proportional to the anode input voltage, the anode input current and the transmitter output power; and determining the input power to the transmitter anode based on the product of the anode input voltage and anode input current signals.

* * * * *